United States Patent [19]

Halsey

[11] 3,898,577

[45] Aug. 5, 1975

[54] CONSTANT IMPEDANCE AMPLIFIER

[75] Inventor: Frederick Thomas Halsey, Ottawa, Canada

[73] Assignee: Northern Electric Company Limited, Montreal, Canada

[22] Filed: Sept. 26, 1974

[21] Appl. No.: 509,392

[52] U.S. Cl. .................... 330/28; 330/32; 330/102

[51] Int. Cl.$^2$ .................... H03F 1/34

[58] Field of Search ............ 330/28, 32, 87, 50, 102

[56] References Cited

UNITED STATES PATENTS 3,437,948 4/1969 Simons .................... 330/28

*Primary Examiner*—James B. Mullins

*Attorney, Agent, or Firm*—John E. Mowle

[57] ABSTRACT

A high powered transistor amplifier for use in broadband VHF circuits which utilizes a pair of transistors connected in a Darlington configuration with separate emitter resistors. The component values of the emitter resistors and the feedback resistor being such as to provide constant impedance operating conditions together with good linearity.

3 Claims, 1 Drawing Figure

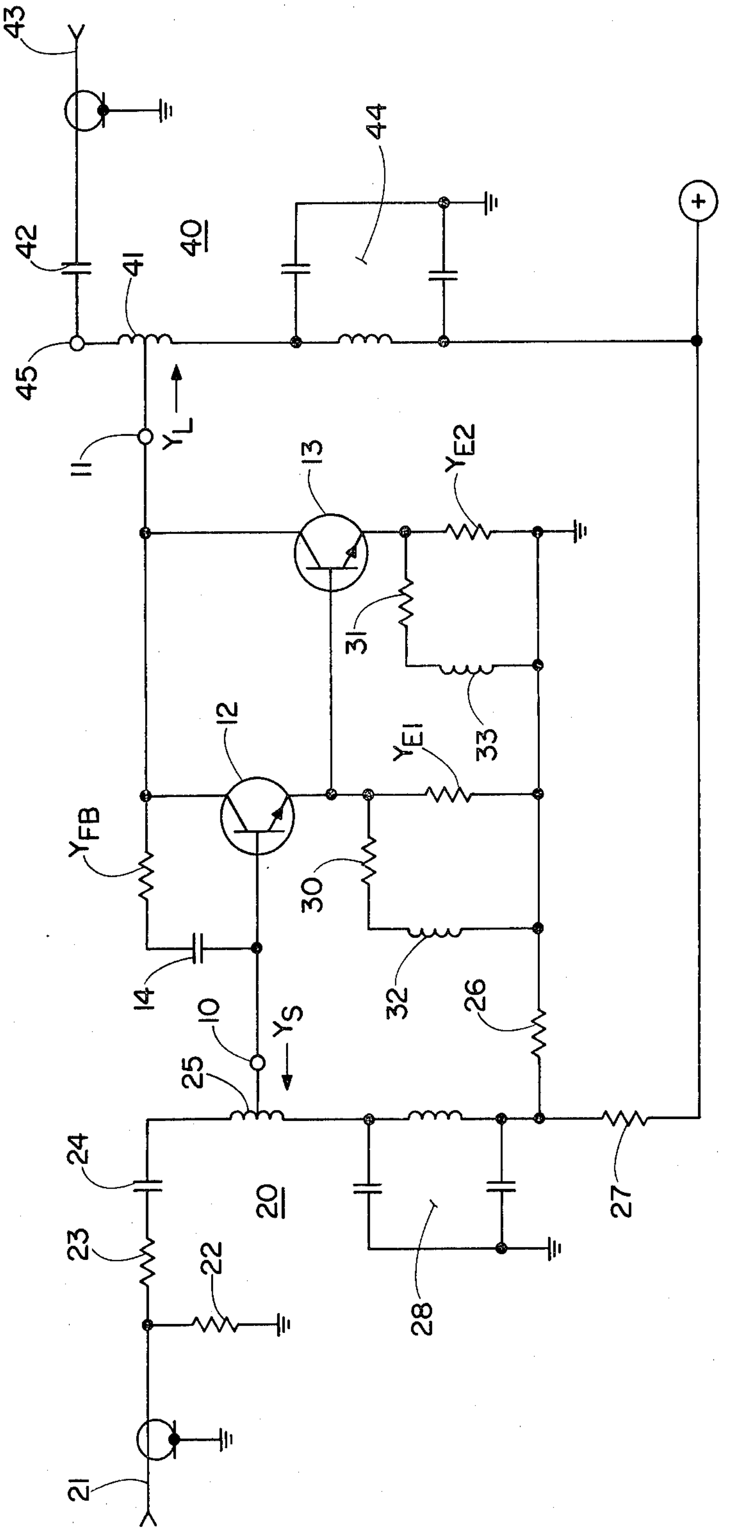
43
44
42
41
40
45
11
$Y_L$
13
$Y_{E2}$
31
33
12
$Y_{E1}$
$Y_{FB}$
30
14
32
26
10
$Y_S$
25
24
20
27
23
22
28
21

CONSTANT IMPEDANCE AMPLIFIER

This invention relates to a constant impedance transistor amplifier and more particularly to a Class A high powered transistor amplifier for use in broadband VHF circuits.

BACKGROUND OF THE INVENTION

It is known that a single transistor amplifier will exhibit both a constant input and output impedance when connected in a common emitter configuration such that:

$$Y_S \approx Y_L \approx \sqrt{Y_{FB} \cdot Y_E}$$

where:

$Y_S$ = the admittance of the source, normally resistive;

$Y_L$ = the admittance of the load, normally resistive;

$Y_{FB}$ = the admittance of the feedback resistor connected between the collector and base of the transistor, essentially resistive; and $Y_E$ = the admittance of the emitter resistor, essentially resistive.

A typical circuit of this type is illustrated in the "Motorola Semiconductor Data Book" 5th Edition, Supplement 1, May 1971, pages 6–109 to 6–112, FIG. 2. Excellent VHF amplifier designs can be obtained utilizing this circuit providing the transistor used has a high-gain bandwidth product and assuming the collector-base junction capacity is small.

In designing a Class A power transistor amplifier, the bias conditions are selected for maximum output power and best linearity, staying within the safe operating region of the transistor. Normally this is obtained by setting the collector current for the highest gain-bandwidth product and the collector-base voltage for the highest voltage possible so as not to exceed either the breakdown voltage or the dissipation limits of the transistor. Having chosen this bias point, the output impedance and/or the transistor are then chosen to obtain a load line which gives equal limiting at the voltage and current extremeties of the operating characteristics of the transistor. The gain is then set to give an adequate bandwidth for the required application. Optimizing the circuit shown in the Motorola Handbook utilizing the Motorola 2N5947 transistor (with a gain bandwidth product of 1500 MHz and a collector capacity of 2 pfds) will yield an essentially flat 70 MHz amplifier having a gain of about 7db, which is suitable for use in broadband microwave radio transmission systems.

However, if higher power output is required, a larger transistor such as a TRW PT5707 must be used (with a gain bandwidth product of 500 MHz and a collector capacity of 10 pfds). In order to obtain adequate bandwidth using such a transistor, it is necessary to reduce the gain by reducing the admittance $Y_E$ and increasing the admittance $Y_{FB}$. This has the effect of reducing the output power since both $Y_E$ and $Y_{FB}$ will absorb much power. In practice, the gain cannot be reduced far enough to obtain the necessary bandwidth.

One possible arrangement would be to connect two 2N5947 transistors in parallel in order to double the output power. Unfortunately however this also doubles the collector capacity, the net effect of which is that the gain must be reduced to maintain the necessary bandwidth. The number of stages must be increased making the higher output very expensive. The law of diminishing returns is clearly evident when one considers that one PT5707 transistor has the power capacity of five 2N5947 transistors in parallel.

STATEMENT OF THE INVENTION

It has been discovered that by utilizing two transistors connected as a Darlington pair with separate emitter resistors, a higher power output can be obtained without sacrificing bandwidth or linearity if the admittances have approximately the relationship:

$$Y_S \approx Y_L \approx \sqrt{Y_{FB}(Y_{E1} + Y_{E2})}$$

where:

$Y_{E1}$ and $Y_{E2}$ are the admittances of the two emitter resistors.

Thus, in accordance with the present invention there is provided a constant impedance amplifier comprising input, output and common terminals, the input and common terminals for connection to a single source of admittance $Y_S$ and the output and common terminals for connection to a load of admittance $Y_L$. The amplifier also comprises first and second transistors, the base of the first transistor being connected to the input terminal, the emitter of the first transistor being connected to the base of the second transistor and the collectors of the two transistors being connected together and to the output terminal. In addition, first and second essentially resistive admittances $Y_{E1}$ and $Y_{E2}$ are connected between the respective emitters of the first and second transistors and the common terminal; and an essentially resistive admittance $Y_{FB}$ is connected between the output terminal and the base of the first transistor. The admittances have approximately the relationship given in the above equation. By utilizing the Darlington pair the output power is the sum of the power from the two transistors. The advantage of the Darlington pair circuit is that two higher power PT5707 transistors will give gain and bandwidth comparable to those obtained using the 2N5947 transistor in the common emitter configuration. For comparable linearity the Darlington pair circuit will deliver about 10 times the power of the common emitter circuit, using the transistors described.

BRIEF DESCRIPTION OF THE DRAWING

An example embodiment of the invention will now be described with reference to the accompanying drawing which illustrates a schematic circuit diagram of a constant impedance amplifier.

DESCRIPTION OF THE PREFERRED EMBODIMENT

The single schematic circuit diagram illustrates a constant impedance amplifier which is suitable for amplifying VHF signals at 70 MHz with an input/output impedance of 75 ohms. The techniques however are equally applicable to other applications where a high-powered linear constant impedance amplifier is required. The critical elements of the circuit are designated by reference characters which correspond to those used in the subsequent equations, while the balance are identified by reference numerals.

Referring to the figure of drawings, the basic circuit of the constant impedance amplifier comprises input and output terminals 10 and 11, two NPN transistors 12 and 13 connected as a Darlington pair with the base of the first transistor 12 connected to the input terminal 10, the emitter of the first transistor 12 connected to the base of the second transistor 13, and the collectors of the two transistors connected together and to the output terminal 11. Separate emitter degeneration is obtained from emitter resistors $Y_{E1}$ and $Y_{E2}$ connected between the respective emitters of the transistors 12 and 13 and ground or common terminal. In addition, a feedback resistor $Y_{FB}$ is connected between the output terminal 11 and base of the input transistor 12 in series with a coupling capacitor 14.

An input coupling network generally 20 (forming the source $Y_S$) comprises a coaxial 75Ω input terminal 21, an input resistor 22, a build-out resistor 23, a coupling capacitor 24 and an auto transformer 25. Bias for the input transistor 12 is set by resistors 26 and 27 fed from a positive source of operating voltage and coupled to one end of transformer 25 through an LC decoupling network 28. In order to increase the d-c current through the transistors 12 and 13, resistors 30, 31 in series with coils 32, 33 are connected in shunt with the emitter resistors $Y_{E1}$ and $Y_{E2}$ respectively. An output coupling network generally 40 (forming the load $Y_L$) is connected between the output terminal 11 and ground and comprises an auto transformer 41, one end of which is connected through a coupling capacitor 42 to a 75Ω coaxial output terminal 43. An LC decoupling network 44 connects the other end of the auto transformer 41 to the positive source of operating voltage.

In operation, input signals from a 75Ω source (not shown) are connected to the input coupling network 20, amplified by the pair of transistors 12 and 13 and coupled to a 75 ohm load (not shown) via the output coupling network 40. The circuit is band limited at high frequencies by the imperfections of transistors 12 and 13, and by inductive strays associated with resistors $Y_{E1}$ and $Y_{E2}$, and to a lesser extent by reactive strays associated with the other elements of the circuit. The circuit is band limited at low frequencies by the decoupling circuits 28 and 44, transformers 25 and 41, and coupling capacitors 24, 14 and 42. Over the range of normal operating frequencies between these two frequency limits, the input and output admittances can be made resistive and equal to each other for the approximate conditions $$Y_S \approx Y_L \approx \sqrt{Y_{FB}(Y_{E1} + Y_{E2})}$$

The corresponding operating frequency gain $G_o$ is approximated by the equation $$G_o \cong \frac{Y_{E1} + Y_{E2}}{Y_L}$$

As the frequency is increased or decreased the gain will drop off and the input and output admittances will become susceptive due to imperfections described above. However, these operating frequency conditions can be met over a wide bandwidth. In addition the admittance values used are close to those yielding optimum linearity. In practice, the d-c bias points are set to obtain the maximum output power, thus determining the optimum value of the load admittance, $Y_L$; in a manner similar to that described for the common emitter circuit. Transformers 41 and 25 and resistors 22 and 23 convert $Y_S$ and $Y_L$ to 75 ohms. It is possible to eliminate transformer 25 if the feedback resistor $Y_{FB}$ is connected between input terminal 10 and junction terminal 45. The equations for $Y_S$, $Y_L$ and gain $G_o$ must then be modified to account for the turns ratio of transformer 41 as follows:

$$Y_S \approx Y_L \approx \sqrt{N \cdot Y_{FB}(Y_{E1} + Y_{E2})}$$

Ignoring strays in the external components, the high frequency limitation of the single transistor, constant impedance, common emitter circuit is determined by both the gain-bandwidth product and the collector-base junction capacity of the transistor used. For the open loop condition (i.e. $Y_{FB} = 0$ and $Y_E = \infty$), the gain varies inversely with frequency on a one-for-one basis, that is the open loop gain varies at the rate of 3 dB per octave of frequency. Similarly, the high frequency limitation of the Darlington pair circuit is determined by the gain-bandwidth products and collector-base junction capacities of the transistors used. There are two reasons why the modified Darlington pair configuration provides improved performance. First, the effective collector capacitance of the second transistor is approximately equal to its inherent capacitance divided by the current gain of the first transistor. Second, the effective gain-bandwidth product is the geometric mean of the gain-bandwidth products of the two transistors; and the open loop gain varies inversely with frequency on a two-for-one basis, that is at a rate of 6 dB per octave of frequency. Thus the gain available at the normal operating frequency is much higher than it would be for the 3 dB per octave relationship. The net effect is that larger, higher power transistors can be used.

Typical non-limiting values of the circuit components which can be utilized for a 70 MHz amplifier with a gain of 7 dB and a high frequency cut-off of about 150 MHz are listed below. The output power of this circuit is about 10 dB higher than can be obtained with the single transistor, all-pass, common emitter stage having similar gain, high frequency cut-off and linearity characteristics:

| | | |
|---|---|---|
| Resistors - | $Y_{E1}$, $Y_{E2}$ | = 15Ω |
| " | $Y_{FB}$ | = 180Ω |
| " | 21 | =1 KΩ |
| " | 22 | = 22Ω |
| " | 26 | = 62Ω |
| Resistors - | 27 | = 330Ω |
| " | 30, 31 | = 18Ω |
| Capacitors 14, 23, 41 | | = 1500 pfd |
| Transformers 25, 41 | | = 7:6 turns ratio |
| Transistors 12, 13 | | = PT5707 |

In a conventional Darlington circuit used for power applications, transistor 12 is a low-power device driving the high-power transistor 13. However, for the present application it has been found that best results are obtained by utilizing the same type of transistors. In this way, the transistors 12 and 13 deliver equal power to the load, thereby essentially doubling the power which is obtained using the low-power, high-power combination. Since the admittance of the emitter resistors $Y_{E1}$ and $Y_{E2}$ is inversely proportional to the power which they draw, they too will be equal in value.

The fundamental power handling limitation of any amplifier is limited on either voltage or current at the end excursions of the load line, and on the linearity of the low frequency characteristics of the transistor. Assuming that the signal is not clipping and the low frequency characteristics have good linearity, VHF amplifiers may still be non-linear because of non-linearities of those characteristics affecting high frequency performance. For example, the collector-base and emitter-base junction capacities are heavily dependent on the collector-base voltage.

If in a particular application, a constant impedance amplifier is used to drive a non-linear up-converter, harmonics generated in the up-converters are fed back into the output of the amplifier, where they are reconverted to the fundamental frequency. A signal impressed across the output divides into two, part going into the collector of the transistor where it sees the output non-linearity, and part around the feedback loop. The feedback signal splits between the source admittance and the base of the transistor. The signal going into the base sees the input non-linearity of the transistor is amplified and passed back to its collector. If the non-linear portion of this signal cancels that impressed directly on the collector, the output admittance will appear linear. To get cancellation the phase and magnitude of the non-linearity in the feedback signal must be adjusted accordingly. This is affected by the non-linearities in the transistor as well as by the source admittance, the feedback resistor and the emitter resistance. Such requirements aare difficult to achieve utilizing a single transistor. However, the output admittance of the amplifier of the present invention can be made linear by making admittances $Y_{FB}$, $Y_S$ and $Y_{E1}$ essentially resistive and of such values required to maintain constant impedance conditions. Optimizing the circuit for matched conditions results in an increase of about 5 dB in second harmonic to fundamental conversion. However, this is still about 5 dB better than could be obtained utilizing a single transistor in a common base configuration. With the common base configuration there is no feedback and the impressed signal sees only the collector-base conjunction capacity.

What is claimed is:

1. A constant impedance amplifier comprising:

input, output and common terminals, the input and common terminals being connected to a signal source of admittance $Y_S$, and the output and common terminals being connected to a load of admittance $Y_L$;

first and second transistors, the base of the first transistor being connected to said input terminal, the emitter of the first transistor being connected to the base of the second transistor, and the collectors of the two transistors being connected together and to said output terminal;

means for coupling operating voltages to said transistors;

first and second resistive admittances $Y_{E1}$ and $Y_{E2}$ connected between the respective emitters of the first and second transistors and the common terminal; and a resistive admittance $Y_{FB}$ connected between the collectors and the base of the first transistor;

the admittances having approximately the relationship:

$$Y_S \approx Y_L \approx \sqrt{Y_{FB}(Y_{E1} + Y_{E2})}.$$

2. A constant impedance amplifier comprising:

a signal source of admittance $Y_S$;

a load of admittance $Y_L$ including an output transformer having a turns ratio N;

first and second transistors, the base of the first transistor being connected to one terminal of said source, the emitter of the first transistor being connected to the base of the second transistor, the collectors of the two transistors being connected together and to one terminal of said load, and other terminals of the source and load being connected in common;

means for connecting operating voltages to said transistors;

first and second emitter resistors of admittance $Y_{E1}$ and $Y_{E2}$ connected between the respective emitters of the first and second transistors and the common terminal; and a feedback resistor of admittance $Y_{FB}$ connected from the load to the base of the first transistor;

the admittances having approximately the relationship:

$$Y_S \approx Y_L \approx \sqrt{N \cdot Y_{FB}(Y_{E1} + Y_{E2})}.$$

3. A constant impedance amplifier as defined in claim 2 in which the emitter resistors are substantially equal.

* * * * *